(12) United States Patent
Sugita

(10) Patent No.: US 12,304,060 B2
(45) Date of Patent: May 20, 2025

(54) NOZZLE REPLACEMENT TABLE UNIT

(71) Applicant: FUJI CORPORATION, Chiryu (JP)

(72) Inventor: Hiroyoshi Sugita, Kariya (JP)

(73) Assignee: FUJI CORPORATION, Chiryu (JP)

( * ) Notice: Subject to any disclaimer, the term of this patent is extended or adjusted under 35 U.S.C. 154(b) by 787 days.

(21) Appl. No.: 17/614,443

(22) PCT Filed: May 31, 2019

(86) PCT No.: PCT/JP2019/021744
§ 371 (c)(1),
(2) Date: Nov. 26, 2021

(87) PCT Pub. No.: WO2020/240828
PCT Pub. Date: Dec. 3, 2020

(65) Prior Publication Data
US 2022/0234217 A1 Jul. 28, 2022

(51) Int. Cl.
*B25J 15/04* (2006.01)
*B25J 15/06* (2006.01)

(52) U.S. Cl.
CPC ....... *B25J 15/0433* (2013.01); *B25J 15/0616* (2013.01)

(58) Field of Classification Search
CPC ............... B25J 15/0433; B25J 15/0616; B25J 15/0683; B25J 15/0691
USPC .................................. 294/64.3, 65, 183, 189
See application file for complete search history.

(56) References Cited

U.S. PATENT DOCUMENTS

| | | | |
|---|---|---|---|
| 3,377,096 A * | 4/1968 | Wood | B66C 1/0231 248/363 |
| 4,703,966 A * | 11/1987 | Lewecke | B66C 1/0243 294/188 |
| 5,485,654 A * | 1/1996 | Nespodzany, Jr. | B64G 1/22 16/422 |
| 6,155,795 A * | 12/2000 | Schmalz | B65H 3/0883 417/151 |
| 7,261,350 B2 * | 8/2007 | Isetani | B25J 15/0616 294/185 |
| 9,815,209 B2 * | 11/2017 | Pinet | B25J 15/0616 |
| 10,184,608 B2 * | 1/2019 | Huang | F16M 11/2092 |
| 10,681,851 B2 * | 6/2020 | Ziadeh | H05K 13/0409 |
| 10,889,007 B2 * | 1/2021 | Reinhold | B65G 47/91 |

(Continued)

FOREIGN PATENT DOCUMENTS

| | | |
|---|---|---|
| CN | 104564935 A | 4/2015 |
| CN | 107584882 A | 1/2018 |
| EP | 3 179 838 A1 | 6/2017 |

(Continued)

OTHER PUBLICATIONS

International Search Report mailed on Aug. 6, 2019 in PCT/JP2019/021744 filed on May 31, 2019 (2 pages).

*Primary Examiner* — Paul T Chin
(74) *Attorney, Agent, or Firm* — Oblon, McClelland, Maier & Neustadt, L.L.P.

(57) ABSTRACT

A nozzle replacement table unit includes a nozzle container configured to accommodate multiple nozzles for replacement, a pedestal to which the nozzle container is detachably attached, a fixing mechanism configured to fix the nozzle container to the pedestal, and an operation section configured to release fixing by the fixing mechanism. The operation section is provided in the nozzle container.

9 Claims, 12 Drawing Sheets

(56) References Cited

U.S. PATENT DOCUMENTS

2020/0130957 A1* 4/2020 Borowski ............ B25J 15/0616
2022/0295681 A1* 9/2022 Kuroda .............. H05K 13/0404

FOREIGN PATENT DOCUMENTS

JP   2009-117580 A   5/2009
KR   1998-054688 A   9/1998

* cited by examiner (a)

(b)

NOZZLE REPLACEMENT TABLE UNIT

TECHNICAL FIELD

The present specification discloses a nozzle replacement table unit.

BACKGROUND ART

In the conventional art, as a nozzle replacement table unit of this type, there has been proposed a unit including a base member fixed to a component mounting device and a nozzle holding member detachably attached to the base member (refer to, for example, Patent Literature 1). The base member has a rectangular flat plate section, a fixed locking section extending upward from an end portion on the rear end side of the flat plate section, and a movable locking section provided on a main support column extending perpendicularly downward from an end portion on the front end side of the flat plate section. A lower end portion of the movable locking section is pivotally supported at the main support column so as to be swingable in a front-rear direction, and an upper end portion thereof is biased toward the rear end by a biasing spring. A pair of left and right protruding section protruding to the rear end side of the flat plate section are provided on an upper portion of the movable locking section, and an operation section extending away from the rear end of the flat plate section in order to perform a swinging operation of the movable locking section is provided on the upper end portion of the movable locking section. The nozzle holding member is a rectangular plate member and has multiple nozzle holding holes into which nozzles are inserted from the above. In order to attach the nozzle holding member to the base member, first, an operator tilts the rear end portion of the nozzle holding member to be below the front end portion, and causes the rear end portion to come into contact with (abut on) the fixed locking section of the base member. Next, the operator places the nozzle holding member in the horizontal posture while pressing the rear end portion of the nozzle holding member against the fixed locking section of the base member, and causes the lower surface of the nozzle holding member to contact the upper surface of the flat plate section of the base member while performing an operation of the operation section with the hand to swing the movable locking section of the base member in the direction away from the rear end. The operator take his hand off the movable locking section in a state in which the nozzle holding member is in the horizontal posture and the lower surface thereof is in contact with the upper surface of the flat plate section of the base member. Consequently, the movable locking section is swung by the biasing force of the biasing spring and the pair of left and right protruding sections comes into contact with the front end tilted portion of the nozzle holding member from above, so that the nozzle holding member is coupled to the base member. In order to detach the nozzle holding member from the base member, the operator swings the movable locking section with the hand against the biasing force of the biasing spring, then lifts the front end portion of the nozzle holding member while pressing the rear end portion of the nozzle holding member against the fixed locking section of the base member, and then pulls the nozzle holding member forward.

PATENT LITERATURE

Patent Literature 1: JP-A-2009-117580

BRIEF SUMMARY

Technical Problem

However, in the nozzle replacement table unit disclosed in Patent Literature 1, when the nozzle holding member is attached to or detached from the base member, it is necessary to hold the nozzle holding member with one hand and operate the movable locking section (operation section) with the other hand, and thus there is a problem that the operability is poor.

It is a principal object of the present disclosure to further improve the operability when a nozzle container is detached from a pedestal.

Solution to Problem

The present disclosure employs the following means in order to achieve the above principal object.

According to the present disclosure, there is provided a nozzle replacement table unit including a nozzle container configured to accommodate multiple nozzles for replacement; a pedestal to which the nozzle container is detachably attached; a fixing mechanism configured to fix the nozzle container to the pedestal; and an operation section configured to release fixing by the fixing mechanism, in which the operation section is provided in the nozzle container.

In the nozzle replacement table unit according to the present disclosure, in a case where the nozzle container accommodating multiple replacement nozzles is detachably fixed to the pedestal by the fixing mechanism, the operation section for releasing the fixing by the fixing mechanism is provided in the nozzle container. According to this nozzle replacement table unit, since an operator can detach the nozzle container from the pedestal by operating the operation section with one hand to release the fixing by the fixing mechanism while grasping the nozzle container with the hand, the operability can be further improved.

DESCRIPTION OF EMBODIMENTS

Next, embodiments of the present disclosure will be described with reference to the drawings.

Figure 1:
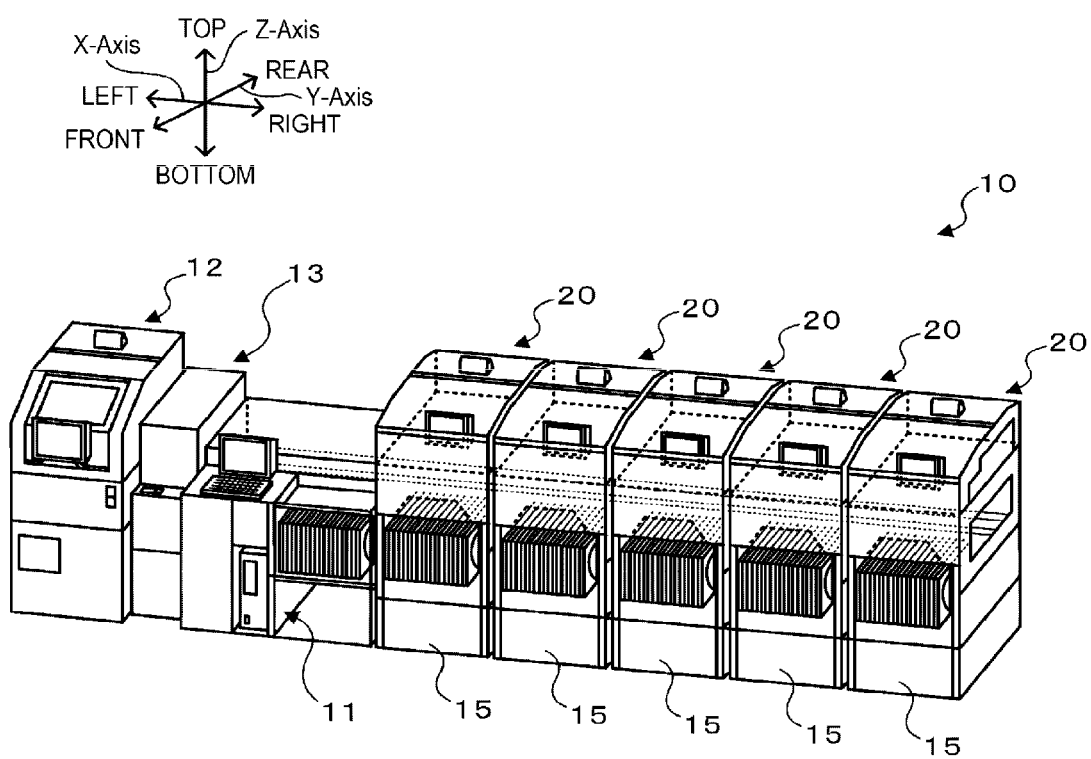
FIG. 1 is a configuration diagram schematically illustrating a configuration of component mounting system 10.
Figure 2:
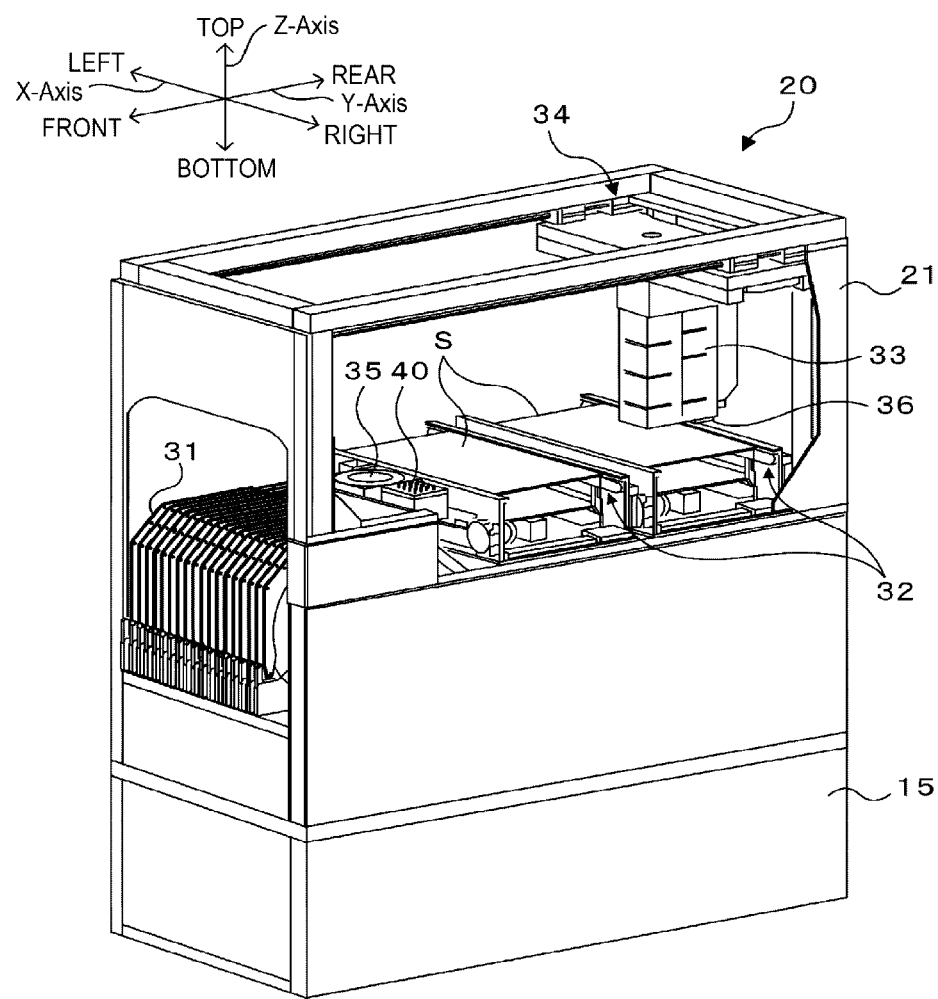
FIG. 2 is an appearance perspective view of component mounter 20.
Figure 3:
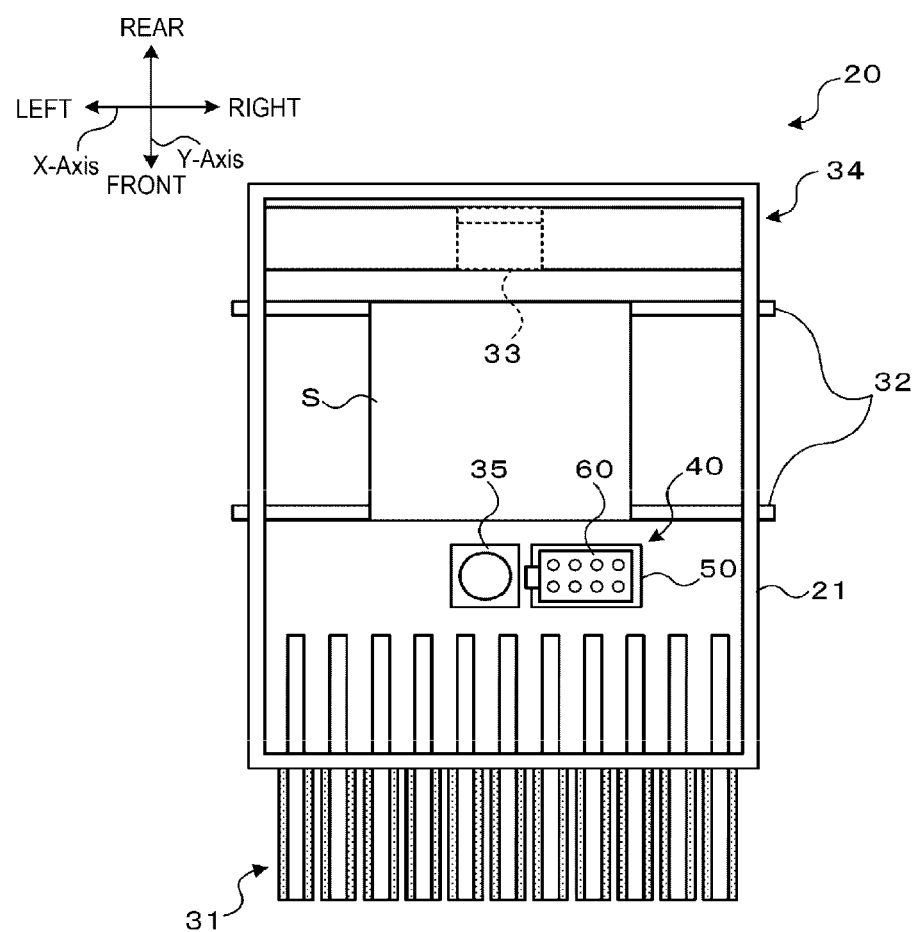
FIG. 3 is a top view of component mounter 20.
Figure 4:
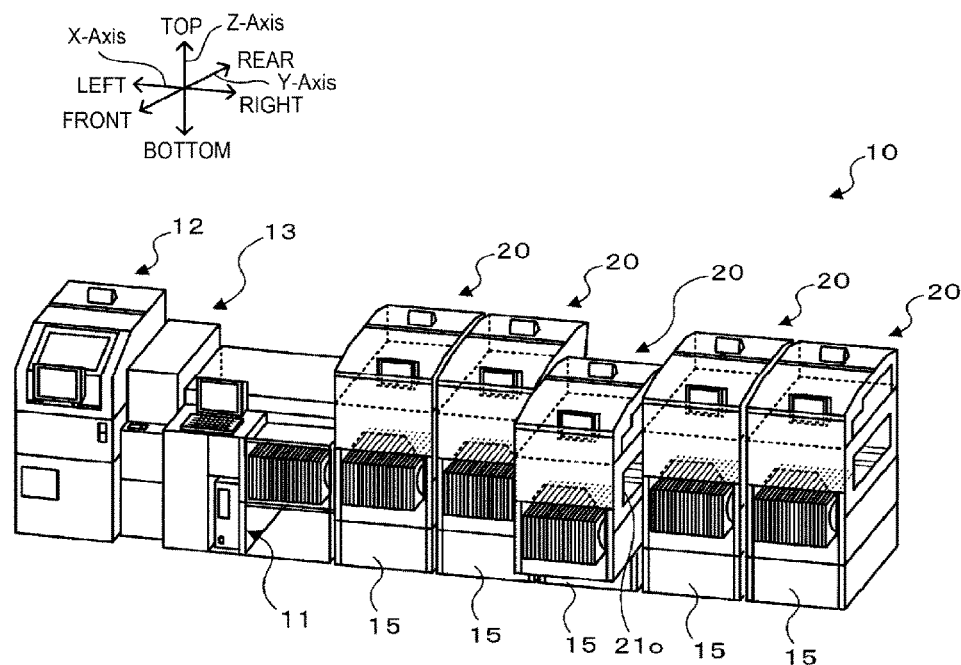
FIG. 4 is an explanatory diagram illustrating a state of component mounting system 10 at the time of a setup change or the occurrence of error.

FIG. 1 is a configuration diagram schematically illustrating a configuration of component mounting system 10. FIG. 2 is an appearance perspective view of component mounter 20. FIG. 3 is a top view of component mounter 20. FIG. 4 is an explanatory diagram illustrating a state of component mounting system 10 at the time of a setup change or the occurrence of an error. In FIGS. 1 and 2, a left-right direction is set as an X-axis direction, a front-rear direction is set as a Y-axis direction, and an up-down direction is set as a Z-axis direction.

As illustrated in FIG. 1, component mounting system 10 includes management device 11, printing machine 12, printing inspection machine 13, multiple component mounters 20, and a mounting inspection machine (not illustrated). Management device 11 manages the entire system. Printing machine 12 prints a solder on board S to form a circuit pattern. Printing inspection machine 13 inspects a state of the solder printed by printing machine 12. Component mounters 20 are respectively placed on bases 15 aligned along a conveyance direction (X direction) of board S and mount components on board S. The mounting inspection machine inspects mounting states of the components mounted by component mounter 20. Printing machine 12, printing inspection machine 13, multiple component mounters 20, and the mounting inspection machine are provided to be arranged in the conveyance direction of board S to configure a production line.

As illustrated in FIG. 2, component mounter 20 includes feeder 31, board conveyance device 32, head 33, head moving device 34, part camera 35, mark camera 36, and nozzle replacement table unit 40 according to the present embodiment including nozzle container 60 that accommodates a replacement suction nozzle. Feeder 31 includes, for example, a reel on which a tape accommodating multiple components is wound, and is configured as a tape feeder that supplies components by drawing the tape from the reel and feeding the tape by a predetermined amount. Board conveyance device 32 includes, for example, a pair of belts arranged in the Y-axis direction, and is configured as a belt conveyor device that conveys board S on the belt in the X-axis direction by driving the pair of belts. Head 33 is attached with a suction nozzle, and picks up a component supplied by feeder 31 with the suction nozzle. Head moving device 34 is configured as, for example, an orthogonal robot including a Y-axis slider movable in the Y-axis direction along a Y-axis rail installed in an upper portion of housing 21, and an X-axis slider movable in the X-axis direction along an X-axis rail installed in the Y-axis slider. Head 33 is attached to the X-axis slider, and is movable in the X-axis direction and the Y-axis direction by head moving device 34. In the present embodiment, multiple types of heads 33 may be attached to the X-axis slider. Multiple types of heads 33 include, for example, heads to which different numbers of suction nozzles are attachable, heads movable up and down, and heads that are not movable up and down. Part camera 35 is installed in a space between feeder 31 and board conveyance device 32, and images a component from below when the suction nozzle that has picked up the component passes over part camera 35. Mark camera 36 is attached to head 33 so as to be movable in the X-axis direction and the Y-axis direction by head moving device 34, and images a reference mark (not illustrated) added to the upper surface of board S above board S in order to recognize a position of board S that has been conveyed in. When the suction nozzle attached to head 33 is replaced, mark camera 36 images a code (not illustrated) added to the upper surface of nozzle container 60 above nozzle container 60 in order to recognize the type of nozzle container 60 on which mark camera 36 is mounted.

A pair of rails (not illustrated) extending in a direction (the Y-axis direction) orthogonal to the board conveyance direction (the X-axis direction) are provided on the upper surface of base 15. Component mounter 20 is movable in the Y-axis direction along the pair of rails with respect to base 15. As illustrated in FIG. 4, opening 21o is formed in a side surface (a surface in the board conveyance direction) of housing 21 of component mounter 20. When a setup change or an error occurs, the operator pulls target component mounter 20 toward the front of base 15, and thus performs necessary work on component mounter 20 via opening 21o.

Figure 5:
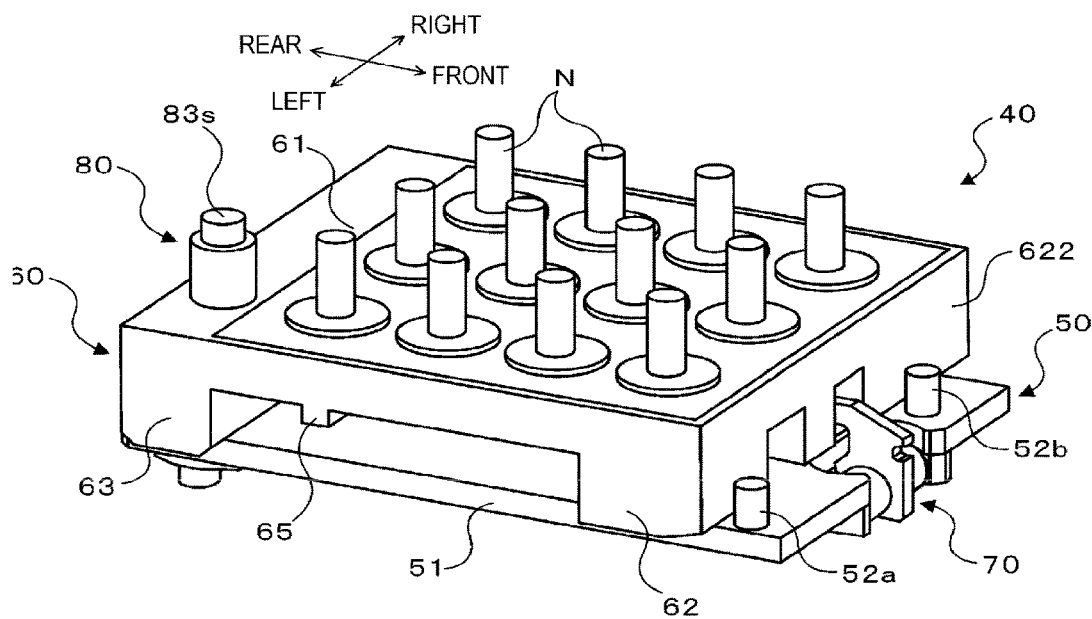
FIG. 5 is an appearance perspective view of nozzle replacement table unit 40 according to the present embodiment.
Figure 6:
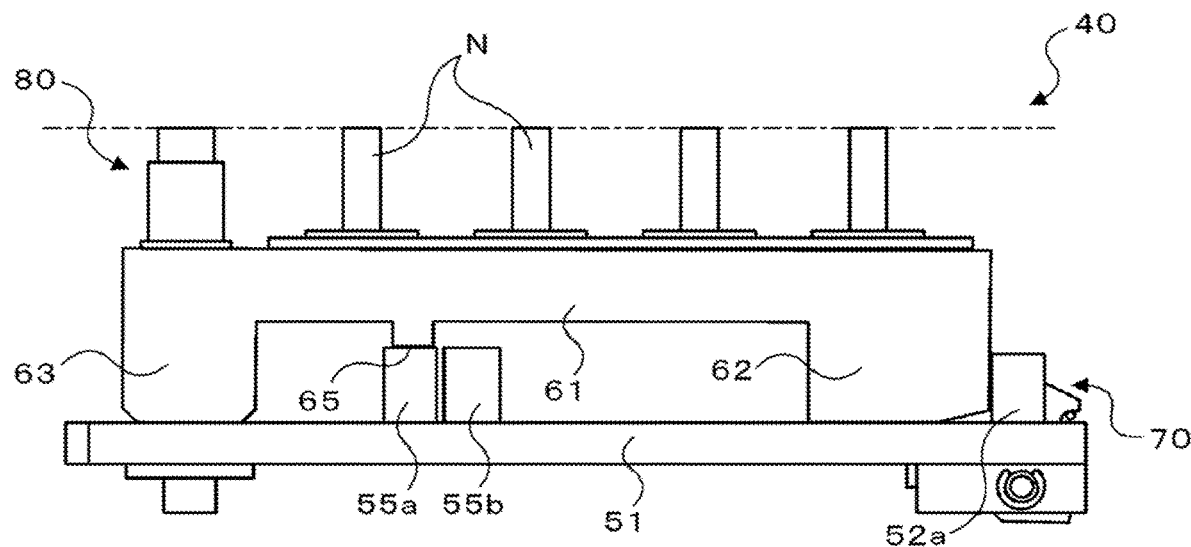
FIG. 6 is a side view of nozzle replacement table unit 40.
Figure 7:
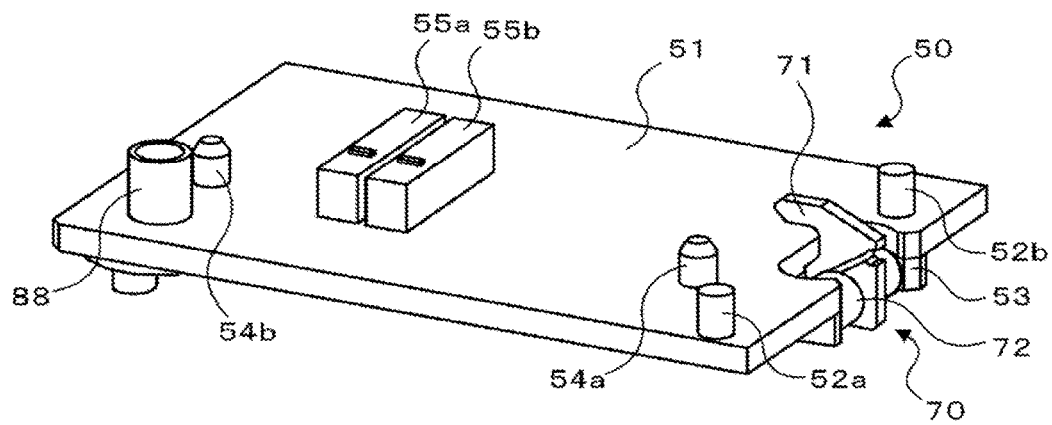
FIG. 7 is an appearance perspective view of pedestal 50.
Figure 8:
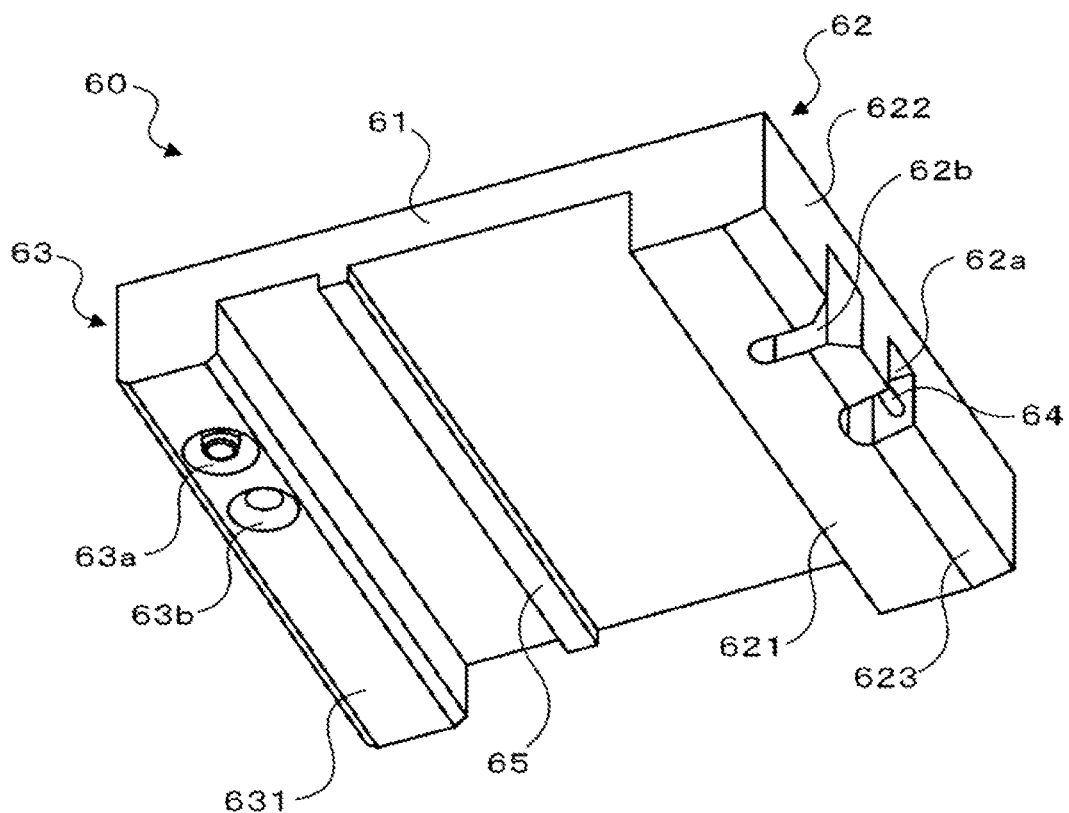
FIG. 8 is a perspective view in which nozzle container 60 is viewed from a bottom surface thereof.
Figure 9:
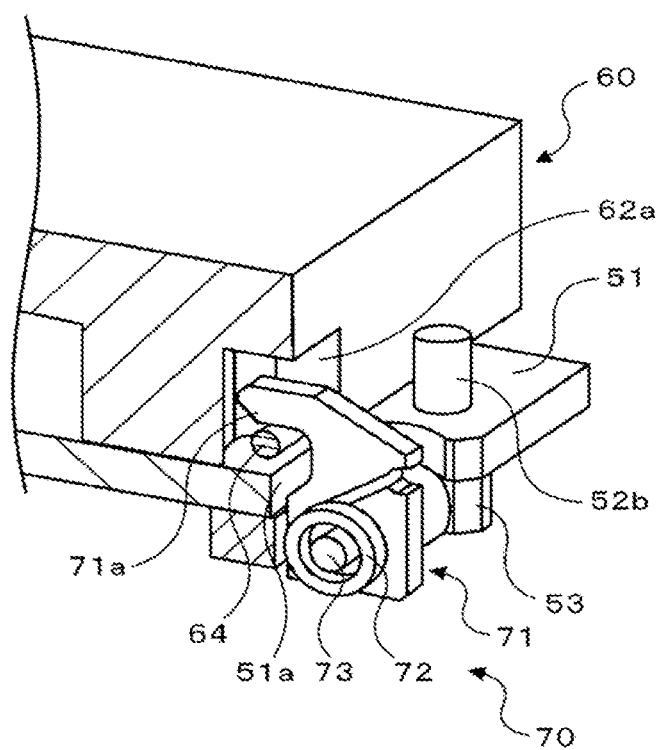
FIG. 9 is a partially enlarged view including hook mechanism 70 of nozzle replacement table unit 40.
Figure 10:
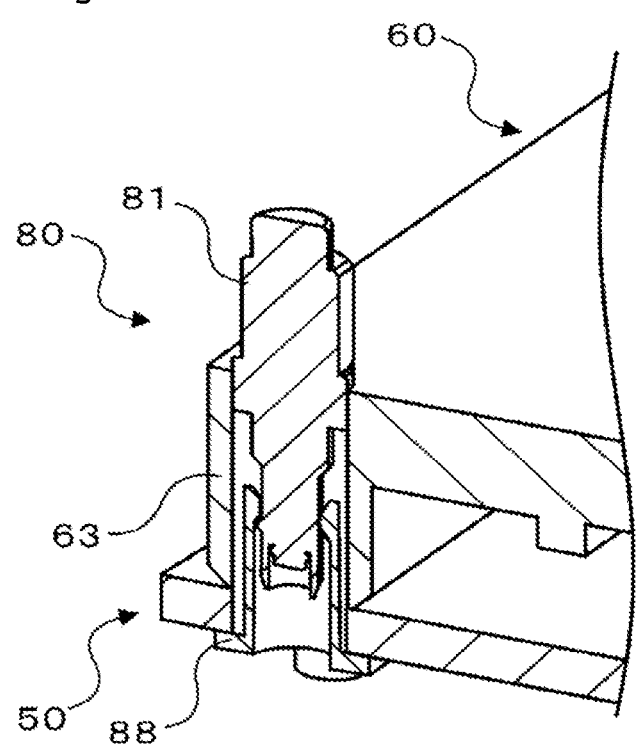
FIG. 10 is a partially enlarged view including clamp mechanism 80 of nozzle replacement table unit 40.
Figure 11:
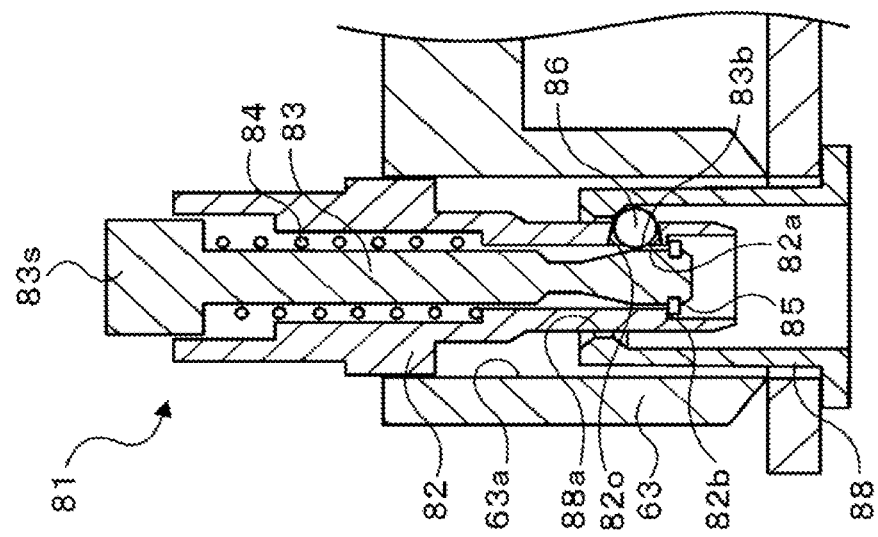
FIG. 11 is a schematic configuration diagram of clamp mechanism 80.
Figure 11:
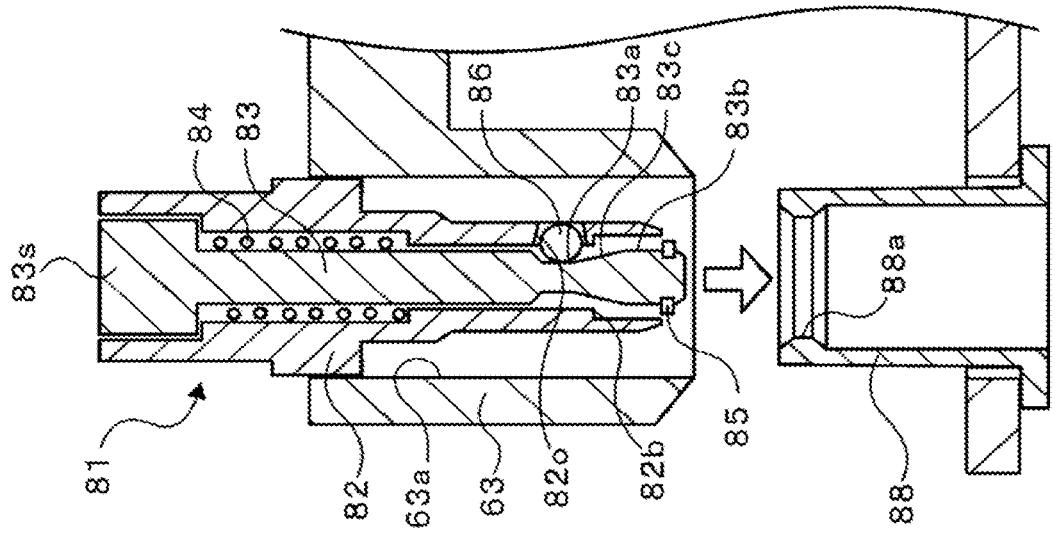
Figure 12:
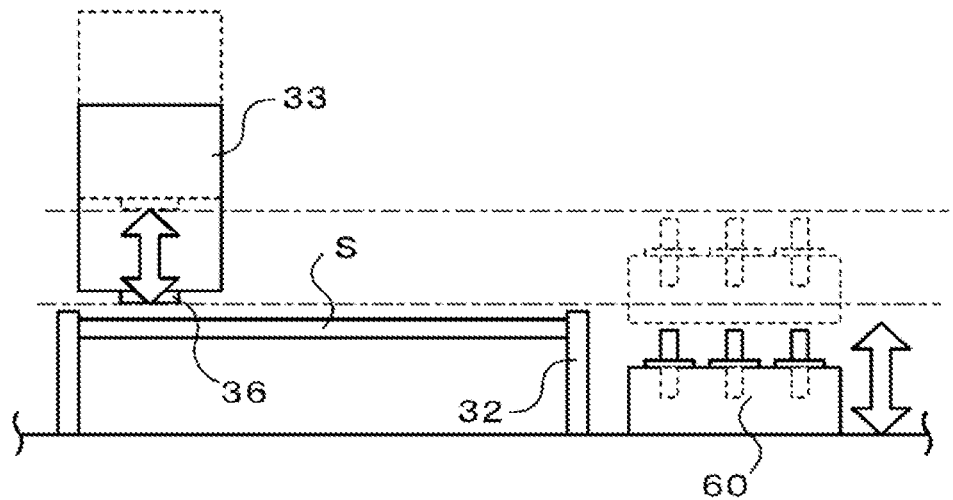
FIG. 12 is an explanatory diagram illustrating an operation state of nozzle containers 60 and 60B.
Figure 12:
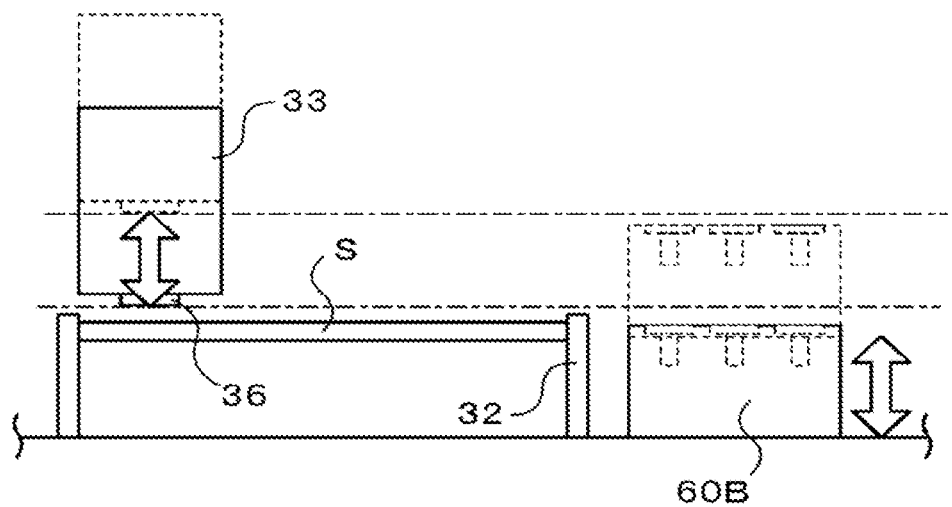

Nozzle replacement table unit 40 of the present embodiment accommodates multiple types of replacement suction nozzles N. FIG. 5 is an appearance perspective view of nozzle replacement table unit 40 of the present embodiment. FIG. 6 is a side view of nozzle replacement table unit 40. FIG. 7 is an appearance perspective view of pedestal 50. FIG. 8 is a perspective view in which nozzle container 60 is viewed from a bottom surface thereof. FIG. 9 is a partially enlarged view including hook mechanism 70 of nozzle replacement table unit 40. FIG. 10 is a partially enlarged view including clamp mechanism 80 of nozzle replacement table unit 40. FIG. 11 is a schematic configuration diagram of clamp mechanism 80. FIG. 12 is an explanatory diagram illustrating an operation state of nozzle containers 60 and 60B.

As illustrated in FIG. 3, FIG. 5, and FIG. 6, nozzle replacement table unit 40 includes pedestal 50 fixed in the space between feeder 31 and board conveyance device 32 so as to be arranged with part camera 35 in the X-axis direction, and nozzle container 60 detachable from pedestal 50.

As illustrated in FIG. 7, pedestal 50 includes rectangular flat plate 51. Stoppers 52a and 52b, guide pins 54a and 54b, seating sensors 55a and 55b, and reception cylinder 88 are provided on an upper surface of plate 51. The stoppers 52a and 52b are formed in a cylindrical shape protruding upward from the upper surface of plate 51, and are spaced in a lateral direction of plate 51 with respect to the first end portion (front end portion) in a longitudinal direction of plate 51. Guide pins 54a and 54b are formed in a cylindrical shape protruding upward from the upper surface of plate 51 and having tapered distal end portions. One guide pin 54a is provided at a position on the front end portion side of plate 51 and deviated further toward the second end portion (rear end portion) side than stoppers 52a and 52b in the longitudinal direction of plate 51. The other guide pin 54*b* is provided at a rear end portion of plate 51. Seating sensors 55*a* and 55*b* are provided to be arranged in the longitudinal direction of plate 51 between the front end portion and the rear end portion of plate 51. Reception cylinder 88 is provided at the rear end portion of plate 51, and is formed in a cylindrical shape protruding upward from the upper surface of plate 51.

As illustrated in FIG. 8, nozzle container 60 includes main body 61, front end side leg section 62, rear end side leg section 63, pole 64, and protruding section 65. Main body is formed in a substantially rectangular parallelepiped shape. Multiple accommodation holes (not illustrated) capable of accommodating replacement suction nozzles N are formed in an upper surface of main body 61.

As illustrated in FIG. 8, front end side leg section 62 protrudes downward from the first end portion (front end portion) of main body 61 in the longitudinal direction with a width of main body 61 in the lateral direction. Front end side leg section 62 are provided with insertion groove 62*a* through which hook mechanism 70 is inserted and guide groove 62*b* into which guide pin 54*a* is fitted when nozzle container 60 is attached to pedestal 50, which are provided to extend in the longitudinal direction of nozzle container 60 from front surface 622. Cylindrical pole 64 is provided inside insertion groove 62*a* to extend in nozzle container 60 in the lateral direction. An opening edge portion of guide groove 62*b* at front surface 622 is chamfered to expand in a tapered manner toward front surface 622.

As illustrated in FIG. 8, rear end side leg section 63 protrudes downward from the second end portion (rear end portion) of main body 61 in the longitudinal direction with the width of main body 61 in the lateral direction. Rear end side leg section 63 is provided with fixing hole 63*a* that penetrates in the up-down direction and to which clamp mechanism 80 is fixed. Rear end side leg section 63 is also provided with guide hole 63*b* recessed upward from lower surface 631 and into which guide pin 54*b* is fitted. An opening edge portion of guide hole 63*b* is chamfered to expand in a tapered manner toward lower surface 631.

As illustrated in FIG. 8, protruding portion 65 protrudes downward from a space between the front end portion and the rear end portion of the bottom surface (lower surface) of main body 61 with a width of main body 61 in the lateral direction, and is configured as a sensed section sensed by either of seating sensor 55*a* or 55*b*.

Here, as illustrated in FIG. 12, nozzle container 60 is configured to be movable up and down to a raised position and a lowered position by a driving device (not illustrated) (for example, an air cylinder). For example, in a case where a board on which components are mounted is produced, nozzle container 60 is retracted to the lowered position such that the suction nozzle or a component picked up by the suction nozzle does not interfere with replacement suction nozzle N accommodated in nozzle container 60 (refer to a solid line in the drawing) when head 33 is moved to an upper side of the component supplied from feeder 31 to pick up the component with the suction nozzle and transfer the component to an upper side of board S. Nozzle container 60 is moved to the lifted position(refer to dashed lines in the drawing) in a case where the suction nozzle attached to head 33 is replaced. Here, component mounter 20 performs, before the suction nozzle is replaced, a code reading operation for reading a code added to the upper surface of nozzle container 60 with mark camera 36 in order to recognize the type of mounted nozzle container 60. In the present embodiment, the nozzle container includes exposed type nozzle container 60 (refer to FIG. 5, FIG. 6, and FIG. 12(*a*)) that accommodates a suction nozzle in a state in which a part of the suction nozzle is exposed upward, and non-exposed type nozzle container 60B that accommodates a suction nozzle in a state in which the suction nozzle is not exposed upward. In a case where a code of exposed type nozzle container 60 is read, the code reading operation is performed in a state in which nozzle container 60 is located at the lifted position since the code deviates from a range of the depth of field of mark camera 36 at the lowered position (retraction position). In a case where a code of non-exposed type nozzle container 60B is read, the code reading operation is performed in a state in which the nozzle container is located at the lowered position since the lowered position (retraction position) can be made higher than that of the exposed type nozzle container within a range that does not interfere with the suction nozzle attached to head 33 or a component picked up by the suction nozzle. Therefore, before performing the operation of reading the code added to the nozzle container by using mark camera 36, component mounter 20 is required to recognize which of the above types the nozzle container is in order to determine an imaging height of mark camera 36 (the up-down position of head 33). In the present embodiment, protruding portion 65 (sensed section) is formed at a position where the protruding portion 65 is sensed by the first seating sensor 55*a* of seating sensors 55*a* and 55*b* when exposed type nozzle container 60 is seated on pedestal 50, whereas the protruding portion is formed at a position where the protruding portion is sensed by the second seating sensor 55*b* of seating sensors 55*a* and 55*b* when non-exposed type nozzle container 60B is seated on pedestal 50. Consequently, component mounting device 20 can identify the type of nozzle container in advance with the simple configuration in which the protruding portion is provided in the nozzle container.

As illustrated in FIG. 7, hook mechanism 70 is disposed in recess 51*a* formed at the center of the front end portion of plate 51. As illustrated in FIG. 7 and FIG. 9, hook mechanism 70 includes hook member 71 and torsion spring 72. Rotation shaft 73 supported by support member 53 fixed to plate 51 and extending in the lateral direction of plate 51 is provided at a lower part of hook member 71. Hook member 71 is supported to be rotatable about rotation shaft 73 with respect to support member 53. An upper portion of hook member 71 is provided with protruding portion 71*a* protruding from the front end portion to the rear end portion of plate 51 with a predetermined gap from the upper surface of plate 51. In the present embodiment, protruding portion 71*a* protrudes to be substantially parallel to the upper surface of pedestal 50 at the rotation end of hook member 71. Torsion spring 72 is attached to rotation shaft 73. A first spring foot of torsion spring 72 is fixed to plate 51, and a second spring foot is fixed to hook member 71. Torsion spring 72 biases the distal end of protruding portion 71*a* in a direction (counterclockwise in FIG. 9) closer to the upper surface of plate 51.

As illustrated in FIG. 10, clamp mechanism 80 includes connection cylinder 81 provided at rear end side leg section 63 of nozzle container 60, and receiving cylinder 88 provided at the rear end portion of corresponding pedestal 50. As illustrated in FIG. 11, connection cylinder 81 includes housing 82, shaft 83, coil spring 84, and ball 86.

Housing 82 is a cylindrical member, and is fixed in a state of being inserted into fixing hole 63*a* that is formed to penetrate through rear end side leg section 63 of nozzle container 60 in the up-down direction. Multiple (for example, three) openings 82o are formed at equal intervals in a circumferential direction at a lower end portion of housing 82.

Shaft 83 is an elongate member inserted into housing 82, and is biased upward with respect to housing 82 by coil spring 84. Operation section 83s pressed and operated by an operator is formed on an upper end portion of shaft 83. Small-diameter section 83a, tapered section 83c, and large-diameter section 83b are formed in this order toward the lower end at a lower end portion of shaft 83. C-ring 85 serving as a retaining ring is attached to large-diameter section 83b. Tapered section 83c is formed such that an outer diameter thereof gradually increases from small-diameter section 83a to large-diameter section 83b. Ball 86 is disposed in a space defined by a region where small-diameter section 83a, tapered section 83c, and large-diameter section 83b of shaft 83 are formed and opening 82o of corresponding housing 82, and appears and disappears with respect to opening 82o due to the up-down motion of shaft 83. That is, when ball 86 is located at small-diameter section 83a of shaft 83, ball 86 is retracted into housing 82; when shaft 83 is moved up, ball 86 is gradually pushed outside in a radial direction by tapered section 83c; and when ball 86 reaches large-diameter section 83b of shaft 83, a part thereof is brought into a state of protruding from opening 82o. Therefore, the operator can retract ball 86 into housing 82 by performing a pressing operation on operation section 83s to lower shaft 83. The operator can cause a part of ball 86 to protrude outside from opening 82o of housing 82 by canceling the pressing operation on operation section 83s and raising shaft 83 with the biasing force of coil spring 84.

Receiving cylinder 88 is a cylindrical member having an inner diameter slightly larger than an outer diameter at the lower end portion of housing 82 and having an outer diameter slightly smaller than an inner diameter of fixing hole 63a. Annular ridge 88a extending inside in the radial direction is formed on the inner peripheral surface of receiving cylinder 88.

The operator inserts connection cylinder 81 into receiving cylinder 88 in a state in which ball 86 is retracted into housing 82 by pressing operation section 83s, and when connection cylinder 81 is inserted into receiving cylinder 88, releases the pressing of operation section 83s such that ball 86 protrudes outside from opening 82o of housing 82. Consequently, ball 86 is fitted into ridge 88a of receiving cylinder 88, and thus connection cylinder 81 is coupled to receiving cylinder 88. As clamp mechanism 80, a ratchet type clamp mechanism may be employed in which connection cylinder 81 is automatically clamped by merely inserting connection cylinder 81 into receiving cylinder 88, and the clamp is released by operating the operation section.

Here, in the present embodiment, a height of operation section 83s is configured to be the same as an upper end height of suction nozzle N accommodated in nozzle container 60, as illustrated in FIG. 6. Nozzle container 60 is designed such that the upper end height of suction nozzle N accommodated in nozzle container 60 has a height not causing interference with suction nozzle N when head 33 is moved, and thus it is possible to also prevent nozzle container 60 from interfering with operation section 83s. A height of operation section 83s may be configured to be lower than the upper end height of suction nozzle N accommodated in nozzle container 60.

Next, in nozzle replacement table unit 40 configured as described above, an operation of replacing nozzle container 60, that is, an operation of detaching nozzle container 60 from pedestal 50 and an operation of attaching new nozzle container 60 to pedestal 50 will be described. The operation of replacing nozzle container 60 is mainly performed at the time of the setup change.

Figure 13:
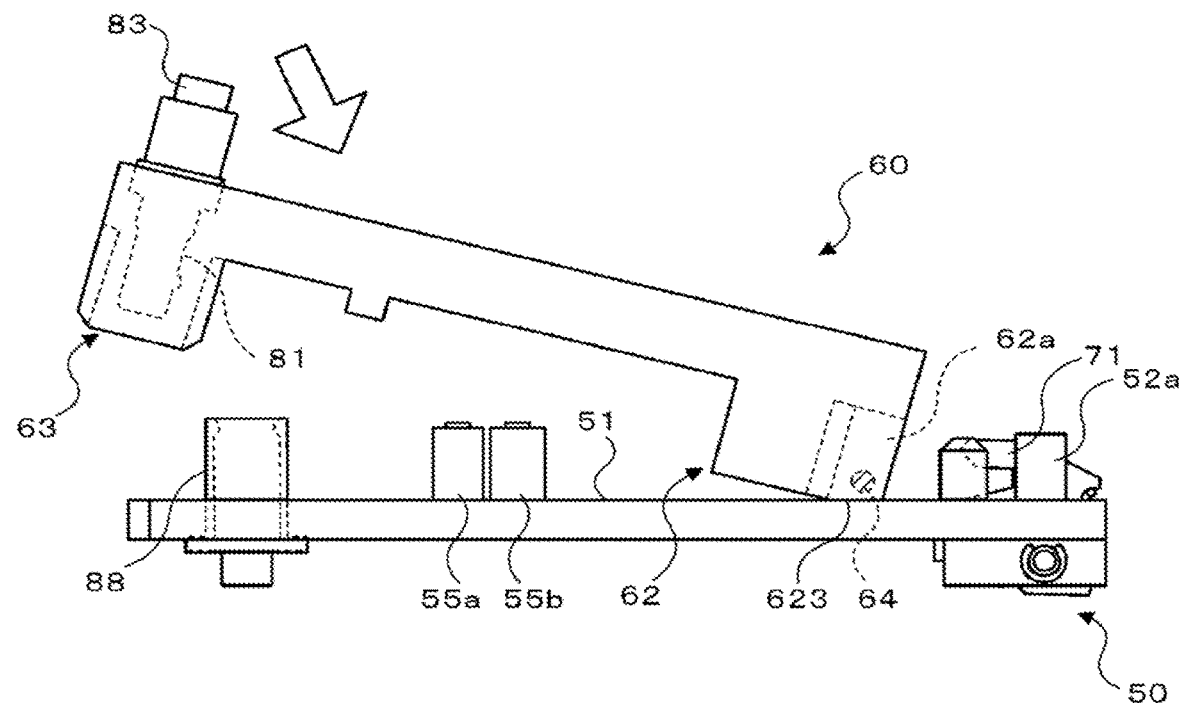
FIG. 13 is an explanatory diagram illustrating a state in which nozzle container 60 is attached to pedestal 50.
Figure 14:
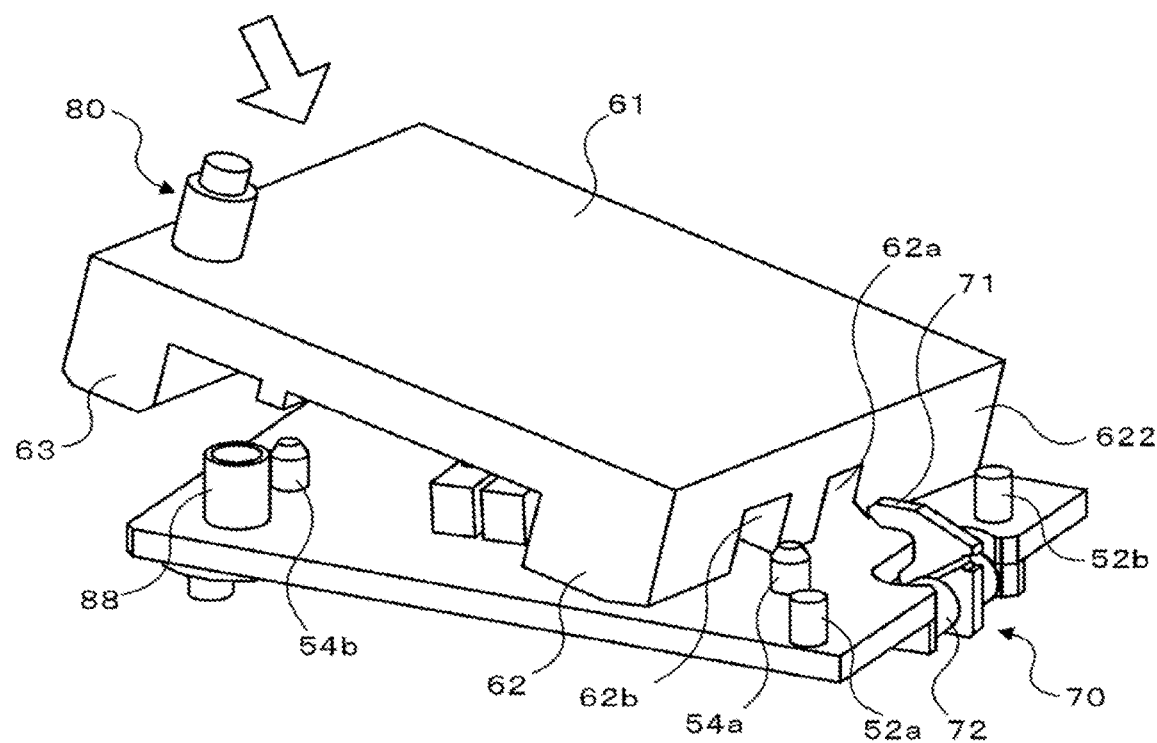
FIG. 14 is an explanatory diagram illustrating a state in which nozzle container 60 is attached to pedestal 50.

First, an operation when nozzle container 60 is attached to pedestal 50 will be described. FIGS. 13 to 19 are explanatory diagrams illustrating a state in which nozzle container 60 is attached to pedestal 50. The replacement suction nozzles are not illustrated in FIGS. 13 to 19. First, as illustrated in FIG. 13 and FIG. 14, an operator tilts front end side leg section 62 of nozzle container 60 to be lower than rear end side leg section 63, and thus front end side leg section 62 contacts the upper surface of pedestal 50. Here, front end side leg section 62 is provided with inclined surface 623 inclined to be parallel to the upper surface of pedestal 50 in a state in which nozzle container 60 is inclined. Therefore, the operator can easily maintain the inclined state of nozzle container 60 by contacting inclined surface 623 of front end side leg section 62 with the upper surface of pedestal 50.

Figure 15:
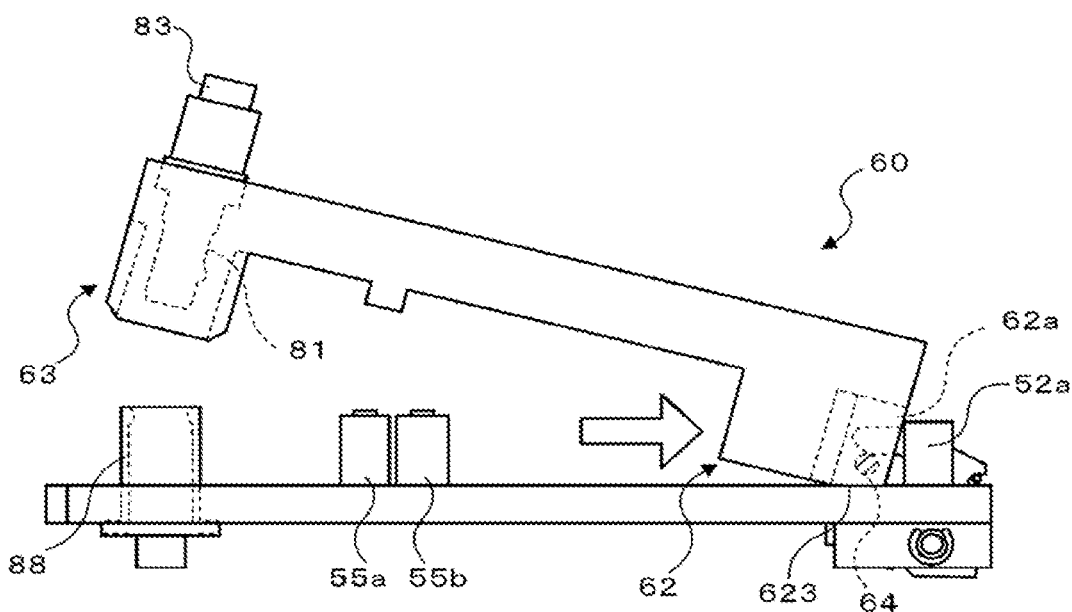
FIG. 15 is an explanatory diagram illustrating a state in which nozzle container 60 is attached to pedestal 50.
Figure 16:
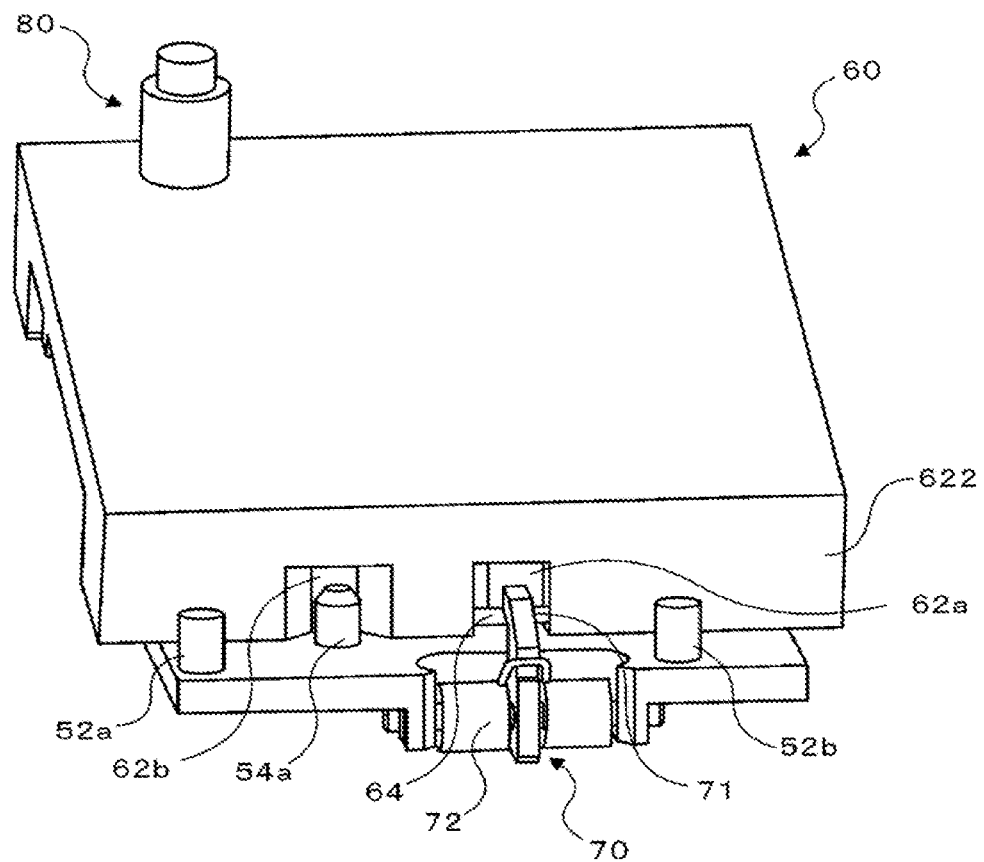
FIG. 16 is an explanatory diagram illustrating a state in which nozzle container 60 is attached to pedestal 50.

Next, as illustrated in FIG. 15, the operator moves (slides) nozzle container 60 forward until front surface 622 of front end side leg section 62 abuts on stoppers 52a and 52b of pedestal 50 while maintaining the tilted state of nozzle container 60. In this case, as illustrated in FIG. 16, guide pin 54a provided on the upper surface of pedestal 50 is fitted into guide groove 62b that extends in the longitudinal direction of nozzle container 60 with respect to front end side leg section 62 of nozzle container 60 and is open to expand at front surface 622. Thus, front surface 622 of front end side leg section 62 of nozzle container 60 is made to abut on stoppers 52a and 52b of pedestal 50 without being positionally deviated in the lateral direction thereof. When front surface 622 of front end side leg section 62 is made to abut on stoppers 52a and 52b, hook member 71 disposed between stoppers 52a and 52b enters insertion groove 62a of front end side leg section 62, and is caught by pole 64 provided in insertion groove 62a.

Figure 17:
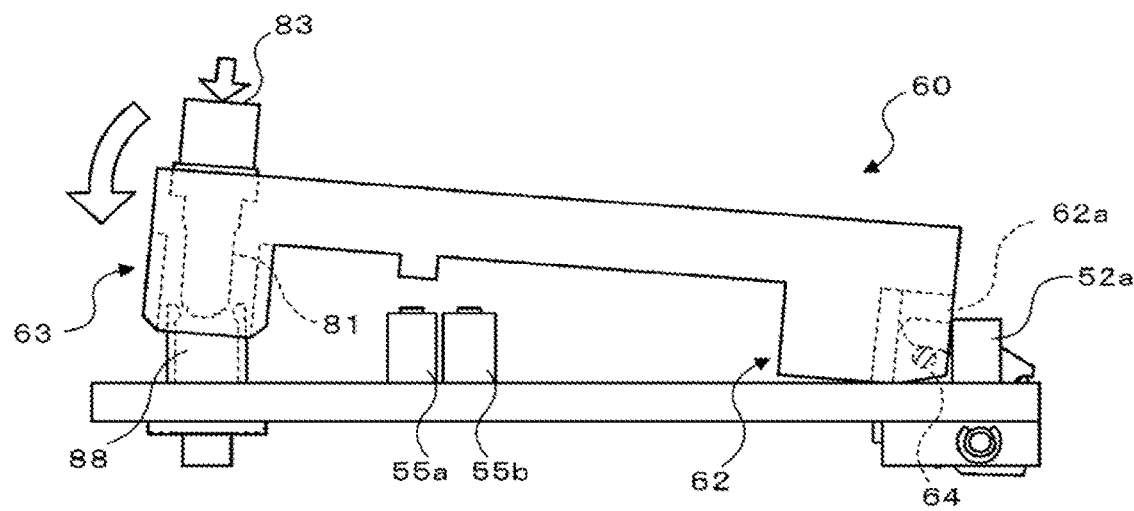
FIG. 17 is an explanatory diagram illustrating a state in which nozzle container 60 is attached to pedestal 50.
Figure 18:
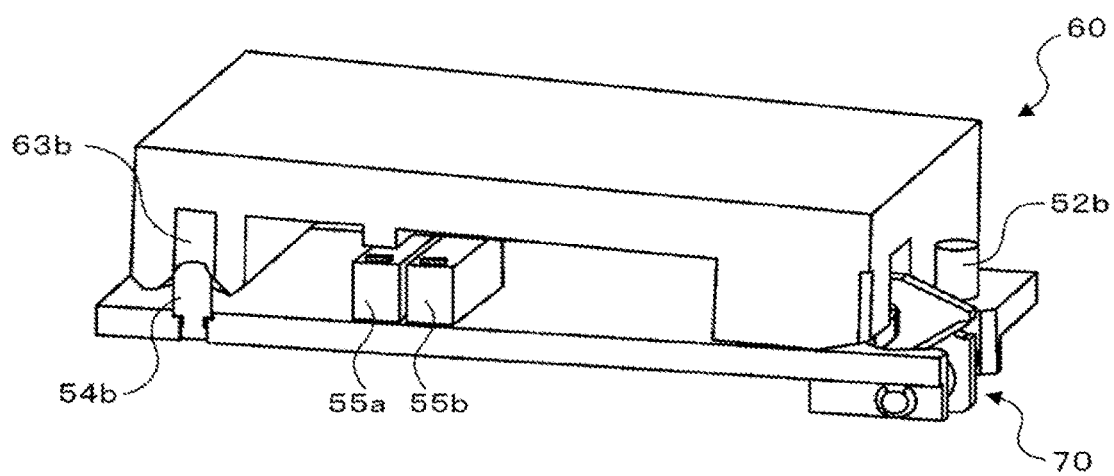
FIG. 18 is an explanatory diagram illustrating a state in which nozzle container 60 is attached to pedestal 50.
Figure 19:
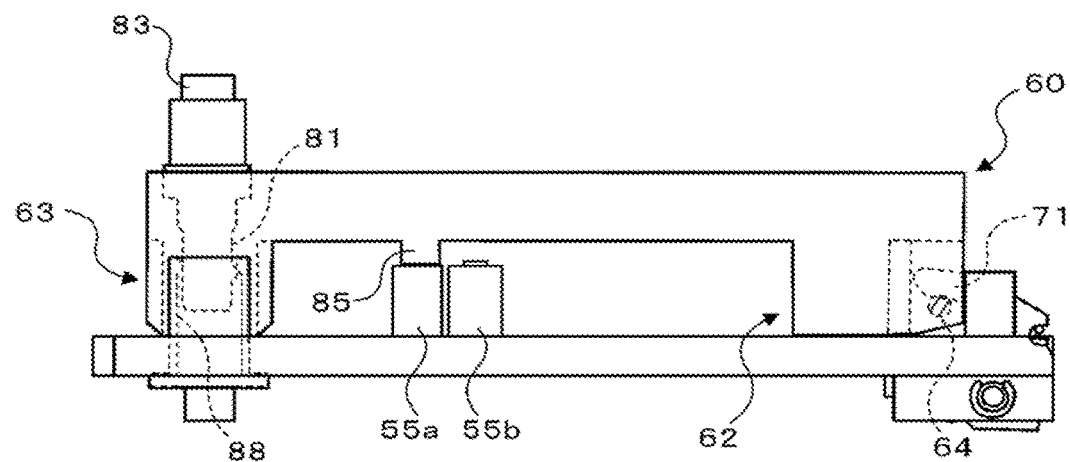
FIG. 19 is an explanatory diagram illustrating a state in which nozzle container 60 is attached to pedestal 50.

As illustrated in FIG. 17, the operator performs a pressing operation on operation section 83s of clamp mechanism 80 while front end side leg section 62 of nozzle container 60 is abutting on the stoppers 52a and 52b of pedestal 50, and lowers rear end side leg section 63 to level nozzle container 60. In this case, as illustrated in FIG. 18, guide pin 54b formed on the upper surface of pedestal 50 is fitted into guide hole 63b formed in lower surface 631 of rear end side leg section 63 and nozzle container 60 is positioned with respect to pedestal 50, and connection cylinder 81 of clamp mechanism 80 is also inserted into receiving cylinder 88 as illustrated in FIG. 19. The operator releases the finger from operation section 83s of clamp mechanism 80 to cancel the pressing operation. As a result, nozzle container 60 is coupled and fixed to pedestal 50. Here, pole 64 is pressed by hook member 71 due to the biasing force of torsion spring 72, and thus nozzle container 60 is brought into a state of being pressed against pedestal 50. Consequently, it is possible to prevent nozzle container 60 from rattling with respect to pedestal 50.

Next, an operation when nozzle container 60 is detached from pedestal 50 will be described. First, the operator presses shaft 83 of clamp mechanism 80 while holding nozzle container 60 with one hand to release clamping by clamp mechanism 80. Next, the operator lifts rear end side leg section 63 of nozzle container 60 to pull connection cylinder 81 from receiving cylinder 88. The operator pulls out nozzle container 60 to the closer side.

Here, the correspondence between the principal elements of the embodiment and the principal elements of the present disclosure described in Description of Embodiments will be described. That is, nozzle container 60 corresponds to a nozzle container, pedestal 50 corresponds to a pedestal, clamp mechanism 80 corresponds to a fixing mechanism, and operation section 83s corresponds to an operation section. Stoppers 52a and 52b correspond to abutted sections, connection cylinder 81 corresponds to a fitting portion, receiving cylinder 88 corresponds to a fitted section, and ball 86 and ridge 88a correspond to a lock section. Guide groove 62b corresponds to a guide groove, and guide pin 54a corresponds to a guide pin. Pole 64 corresponds to a pole, protruding portion 71a of hook member 71 corresponds to a hook section, and torsion spring 72 corresponds to a biasing member. Seating sensors 55a and 55b correspond to multiple sensing sensors, and protruding portion 65 corresponds to a sensed section.

The present disclosure is not limited to the above-described embodiment, and it is needless to say that the present disclosure can be implemented in various forms as long as they fall within the technical scope of the present disclosure.

For example, in the above embodiment, operation section 82s is configured as a push button operated through a pressing operation. However, the operation section may be configured as a lever operated through a swinging operation. Operation section 82s is provided on the upper surface of nozzle container 60, but may be provided on the end surface or the side surface of nozzle container 60.

In the above embodiment, pedestal 50 includes two seating sensors 55a and 55b on the upper surface, and nozzle container 60 includes protruding portion 65 serving as a sensed section that is sensed by one of seating sensors 55a and 55b when being seated on pedestal 50. However, the pedestal may include three or more sensing sensors, and the nozzle container may include a sensed section that is sensed by any of the sensing sensors. Such a seating sensor or a sensed section may be omitted.

As described above, the nozzle replacement table unit of the present disclosure is a nozzle replacement table unit including a nozzle container configured to accommodate multiple replacement nozzles, a pedestal to which the nozzle container is detachably attached, a fixing mechanism configured to fix the nozzle container to the pedestal, and an operation section configured to release fixing by the fixing mechanism, in which the operation section is provided in the nozzle container.

In the nozzle replacement table unit according to the present disclosure, in a case where the nozzle container accommodating multiple replacement nozzles is detachably fixed to the pedestal by the fixing mechanism, the operation section for releasing the fixing by the fixing mechanism is provided in the nozzle container. According to this nozzle replacement table unit, since an operator can detach the nozzle container from the pedestal by operating the operation section with one hand to release the fixing by the fixing mechanism while grasping the nozzle container with the hand, the operability can be further improved.

In the nozzle replacement table unit according to the present disclosure, the operation section may be provided on an upper surface of the nozzle container. With this configuration, the operability can be further improved. In this case, the operation section may be configured such that an upper end height of the operation section is equal to or lower than an upper end height of the nozzle accommodated in the nozzle container. With this configuration, in a case where the nozzle replacement table unit is applied to a component mounter, the nozzle container is designed to have a height at which the head provided in the component mounter does not interfere with the upper end of the nozzle accommodated in the nozzle container when the head is moved, and thus it is possible to prevent interference with the operation section.

In the nozzle replacement table unit of the present disclosure, the pedestal may have an abutted section on which a first end portion of the nozzle container in a longitudinal direction abuts, the fixing mechanism may have a fitting section provided at a second end portion of the nozzle container in the longitudinal direction, a fitted section that is provided at a corresponding part of the pedestal and into which the fitting section is fitted, and a lock section configured to lock a state in which the fitting section is fitted into the fitted section, and the operation section may be a lock releasing operation section configured to release lock of the lock section. In this case, the nozzle container may be moved in the longitudinal direction in a state in which a lower surface of the second end portion is spaced apart from a seating surface of the pedestal and a lower surface of the first end portion is tilted to contact the seating surface of the pedestal, so that the first end portion abuts on the abutted section, and then the lower surface of the second end portion contacts the seating surface of the pedestal such that the nozzle container is fixed to the pedestal, a guide groove extending in the longitudinal direction of the nozzle container may be provided in the lower surface of the first end portion of the nozzle container, and the pedestal may have a guide pin fitted into the guide groove when the nozzle container is moved in the longitudinal direction such that the first end portion abuts on the abutted section in a state in which the lower surface of the first end portion contacts the seating surface. With this configuration, it is possible to prevent the nozzle container from being positionally deviated when the nozzle container is attached to the pedestal.

In the nozzle replacement table unit of the present disclosure, a pole section orthogonal to the longitudinal direction of the nozzle container and extending in a lateral direction may be provided at the first end portion of the nozzle container, and the pedestal may have a hook section fitted into the pole section, and a biasing member configured to bias the hook section in a direction in which the pole section is pressed against a seating surface of the pedestal. With this configuration, since the nozzle container can be pressed against the pedestal by the hook section, it is possible to prevent the nozzle container from rattling with respect to the pedestal when the nozzle container is attached to the pedestal.

In the nozzle replacement table unit according to the present disclosure, the operation section may be configured by a push button. With this configuration, since the nozzle container can be held by one hand and the operation section can be pressed and operated by a finger (for example, a thumb) of the hand, the operability can be further improved.

In the nozzle replacement table unit according to the present disclosure, the pedestal may have multiple sensing sensors each configured to sense seating of the nozzle container, and the nozzle container may have a sensed section that is sensed by any sensing sensor among the multiple sensing sensors. With this configuration, multiple different types of nozzle containers can be identified by merely providing sensed sections on the nozzle containers, and thus a nozzle can be replaced more appropriately.

INDUSTRIAL APPLICABILITY

The present disclosure can be applied to a manufacturing industry for a nozzle replacement table unit, a component mounting system, or the like.

REFERENCE SIGNS LIST

10 Component mounting system, 11 Management device, 12 Printing machine, 13 printing inspection machine, 15 Base, 20 Component mounter, 21 Casing, 210 Opening, 31 Feeder, 32 Board conveyance device, 33 Head, 34 Head moving device, 35 Part camera, 36 Mark camera, 40 Nozzle replacement table unit, 50 Pedestal, 51 Plate, 52a, 52b Stopper, 53 Support member, 54a, 54b Guide pin, 55a, 55b Seating sensor, 60 Nozzle container, 61 Main body, 62 Front end side leg section, 62a Insertion groove, 62b Guide groove, 621 Lower surface, 622 Front surface, 623 Inclined surface, 63 Rear end side leg section, 631 Lower surface, 63a Fixing hole, 63b Guide hole, 64 Pole, 65 protruding portion, 70 Hook mechanism, 71 Hook member, 71a Protruding portion, 72 Torsion spring, 73 Rotation shaft, 80 Clamp mechanism, 81 Connection cylinder, 82 Housing, 82o Opening, 83 Shaft, 83s Operation section, 83a Small-diameter section, 83b Large-diameter section, 83c Tapered section, 84 Coil spring, 85 C ring, 86 Ball, 88 Receiving cylinder, 88a Ridge, N Replacement suction nozzle

The invention claimed is:

1. A nozzle replacement table unit comprising:
   a nozzle container configured to accommodate multiple nozzles for replacement;
   a pedestal to which the nozzle container is detachably attached;
   a fixing mechanism configured to fix the nozzle container to the pedestal; and
   an operation section configured to release fixing by the fixing mechanism, wherein
   the operation section is provided in the nozzle container,
   the fixing mechanism includes a connection cylinder provided at an end portion of the nozzle container in a longitudinal direction, and a receiving cylinder provided at a corresponding part of the pedestal and into which the connection cylinder is fitted,
   the connection cylinder includes
      a housing inserted into a hole penetrating through the end portion of the nozzle container,
      a shaft inserted into the housing, an upper end portion of the shaft being the operation section, and a lower end portion of the shaft including, formed in order toward a lower end of the shaft, a small-diameter section, a tapered section, and a large-diameter section,
      a coil spring which biases the shaft upward with respect to the housing, and
      a ball disposed in a space defined by the lower end portion of the shaft and an opening provided in the housing,
   the receiving cylinder has an inner diameter larger than an outer diameter at a lower end portion of the housing, and includes an annular ridge extending inside in a radial direction and formed on an inner peripheral surface of the receiving cylinder, and
   when the connection cylinder is inserted into the receiving cylinder to fix the nozzle container to the pedestal, the ball is fitted into the ridge of the receiving cylinder.

2. The nozzle replacement table unit according to claim 1, wherein
   the operation section is configured such that an upper end height of the operation section is equal to or lower than an upper end height of the nozzle accommodated in the nozzle container.

3. The nozzle replacement table unit according to claim 1, wherein
   the pedestal has an abutted section on which another end portion of the nozzle container in the longitudinal direction abuts.

4. The nozzle replacement table unit according to claim 3, wherein
   the nozzle container is moved in the longitudinal direction in a tilted state in which a lower surface of the end portion is spaced apart from a seating surface of the pedestal and a lower surface of the another end portion contacts the seating surface of the pedestal, so that the another end portion abuts on the abutted section, and then the lower surface of the end portion contacts the seating surface of the pedestal such that the nozzle container is fixed to the pedestal,
   a guide groove extending in the longitudinal direction of the nozzle container is provided in the lower surface of the another end portion of the nozzle container, and
   the pedestal has a guide pin fitted into the guide groove when the nozzle container is moved in the longitudinal direction such that the another end portion abuts on the abutted section in a state in which the lower surface of the another end portion contacts the seating surface.

5. The nozzle replacement table unit according to claim 3, wherein
   a pole section orthogonal to the longitudinal direction of the nozzle container and extending in a lateral direction is provided at the another end portion of the nozzle container, and
   the pedestal has a hook section fitted into the pole section, and a bias member configured to bias the hook section in a direction in which the pole section is pressed against a seating surface of the pedestal.

6. The nozzle replacement table unit according to claim 1, wherein
   the operation section is configured by a push button.

7. The nozzle replacement table unit according to claim 1, wherein
   the pedestal has multiple sensing sensors each configured to sense seating of the nozzle container, and
   the nozzle container has a sensed section that is sensed by any sensing sensor among the multiple sensing sensors.

8. A nozzle replacement table unit comprising:
   a nozzle container configured to accommodate multiple nozzles for replacement;
   a pedestal to which the nozzle container is detachably attached;
   a fixing mechanism configured to fix the nozzle container to the pedestal; and
   an operation section configured to release fixing by the fixing mechanism, wherein
   the operation section is provided in the nozzle container, wherein
   the pedestal has an abutted section on which a first end portion of the nozzle container in a longitudinal direction abuts,
   the fixing mechanism has a fitting section provided at a second end portion of the nozzle container in the longitudinal direction, a fitted section that is provided at a corresponding part of the pedestal and into which the fitting section is fitted, and a lock section configured to lock a state in which the fitting section is fitted into the fitted section,
   the operation section is a lock releasing operation section configured to release lock of the lock section, the nozzle container is moved in the longitudinal direction in a tilted state in which a lower surface of the second end portion is spaced apart from a seating surface of the pedestal and a lower surface of the first end portion contacts the seating surface of the pedestal, so that the first end portion abuts on the abutted section, and then the lower surface of the second end portion contacts the seating surface of the pedestal such that the nozzle container is fixed to the pedestal, a guide groove extending in the longitudinal direction of the nozzle container is provided in the lower surface of the first end portion of the nozzle container, and the pedestal has a guide pin fitted into the guide groove when the nozzle container is moved in the longitudinal direction such that the first end portion abuts on the abutted section in a state in which the lower surface of the first end portion contacts the seating surface.

9. A nozzle replacement table unit comprising:
a nozzle container configured to accommodate multiple nozzles for replacement;
a pedestal to which the nozzle container is detachably attached;
a fixing mechanism configured to fix the nozzle container to the pedestal; and
an operation section configured to release fixing by the fixing mechanism, wherein
the operation section is provided in the nozzle container,
a pole section orthogonal to the longitudinal direction of the nozzle container and extending in a lateral direction is provided at an end portion of the nozzle container, and
the pedestal has a hook section fitted into the pole section, and a bias member configured to bias the hook section in a direction in which the pole section is pressed against a seating surface of the pedestal.

* * * * *